United States Patent
Wu et al.

(10) Patent No.: US 11,825,671 B2
(45) Date of Patent: Nov. 21, 2023

(54) ELECTROLUMINESCENT DEVICE AND METHOD FOR PREPARING THE SAME, DISPLAY PANEL AND DISPLAY DEVICE

(71) Applicant: BOE TECHNOLOGY GROUP CO., LTD., Beijing (CN)

(72) Inventors: Songquan Wu, Beijing (CN); Xiaobo Du, Beijing (CN); Guanyin Wen, Beijing (CN); Cheng Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 391 days.

(21) Appl. No.: 17/334,466

(22) Filed: May 28, 2021

(65) Prior Publication Data
US 2022/0115614 A1    Apr. 14, 2022

(30) Foreign Application Priority Data
Oct. 12, 2020 (CN) .......................... 202011086202.4

(51) Int. Cl.
*H10K 50/11* (2023.01)
*H10K 50/16* (2023.01)
(Continued)

(52) U.S. Cl.
CPC .......... *H10K 50/11* (2023.02); *H10K 50/166* (2023.02); *H10K 71/00* (2023.02); *H10K 85/324* (2023.02);
(Continued)

(58) Field of Classification Search
None
See application file for complete search history.

(56) References Cited

U.S. PATENT DOCUMENTS

| 2016/0336519 A1* | 11/2016 | Seo ...................... H10K 50/841 |
| 2017/0117480 A1 | 4/2017 | Oh et al. |

(Continued)

FOREIGN PATENT DOCUMENTS

| CN | 106611821 A | 5/2017 |
| CN | 109473561 A | 3/2019 |

(Continued)

OTHER PUBLICATIONS

State Intellectual Property Office of the People's Republic of China, Office Action and Search Report Issued in Application No. 202011086202.4, dated May 7, 2022, 13 pages. (Submitted with Partial Translation).

*Primary Examiner* — Gregory D Clark
(74) *Attorney, Agent, or Firm* — McCoy Russell LLP

(57) ABSTRACT

The present disclosure provides an electroluminescent device and a method for preparing the same, a display panel and a display device. The electroluminescent device includes a light emitting layer, a cathode layer, and an electron transport layer arranged between the light emitting layer and the cathode layer. The electron transport layer includes at least a first electron transport material and a second electron transport material that have different LUMO energy levels, and a ratio EM1/EM2 of the weight content of the first electron transport material to that of the second electron transport material decreases in a direction from a surface thereof proximate to the cathode layer to a surface thereof proximate to the light emitting layer. The electroluminescent device of the present disclosure can improve its efficiency and lifetime.

20 Claims, 4 Drawing Sheets

(51) Int. Cl.
  *H10K 71/00*    (2023.01)
  *H10K 85/30*    (2023.01)
  *H10K 85/60*    (2023.01)
  *H10K 101/40*   (2023.01)
  *H10K 101/30*   (2023.01)
  *H10K 102/00*   (2023.01)

(52) U.S. Cl.
  CPC ..... *H10K 85/6572* (2023.02); *H10K 2101/30* (2023.02); *H10K 2101/40* (2023.02); *H10K 2102/351* (2023.02)

(56) References Cited

U.S. PATENT DOCUMENTS

| | | |
|---|---|---|
| 2021/0043864 A1 | 2/2021 | Li |
| 2021/0384454 A1 | 12/2021 | Zhang et al. |

FOREIGN PATENT DOCUMENTS

| | | |
|---|---|---|
| CN | 109728179 A | 5/2019 |
| CN | 109755405 A | 5/2019 |

* cited by examiner (a)      (b)

ELECTROLUMINESCENT DEVICE AND METHOD FOR PREPARING THE SAME, DISPLAY PANEL AND DISPLAY DEVICE

CROSS-REFERENCE TO RELATED APPLICATION

The present application claims priority to Chinese Patent Application No. 202011086202.4 filed on Oct. 12, 2020. The entire contents of the above-listed application is hereby incorporated by reference for all purposes.

TECHNICAL FIELD

The disclosure relates to the field of display technology, in particular to an electroluminescent device and a method for preparing the same, a display panel and a display device including the electroluminescent device.

BACKGROUND

Organic light emitting diodes (OLED), as a new generation of light emitting display technology after liquid crystal display elements, have many advantages, such as wide viewing angle, high contrast, bright colors, and flexible display. At present, organic light emitting diodes have been widely used in various display devices including a mobile phone and a wearable device, and thus have good application prospects.

Organic light emitting diodes generate light emission by using injection and recombination of carriers (i.e., electrons and holes). However, in current organic electroluminescent diodes, there is usually a phenomenon that carriers are easily accumulated at the interface between the light emitting layer and the carrier transport layer. This phenomenon affects the lifetime and luminous efficiency of the organic light emitting diode device to a certain extent.

SUMMARY

In a first aspect, the present disclosure provides an electroluminescent device, including a light emitting layer, a cathode layer, and an electron transport layer arranged between the light emitting layer and the cathode layer; in which the electron transport layer is a layer of a mixed electron transport material including a first electron transport material and a second electron transport material, and an LUMO energy level of the first electron transport material is lower than that of the second electron transport material; and in which a ratio of a weight content of the first electron transport material to that of the second electron transport material in the electron transport layer is EM1/EM2, and the EM1/EM2 decreases in a direction from a surface of the electron transport layer proximate to the cathode layer to a surface of the electron transport layer proximate to the light emitting layer.

Optionally, the EM1/EM2 gradually decreases in a direction from the cathode layer to the light emitting layer.

Optionally, a content of the first electron transport material in a part of the electron transport layer proximate to the cathode layer and having one-tenth or less of thickness of the electron transport layer is not less than 40 wt. % and not more than 80 wt. %; and a content of the first electron transport material in a part of the electron transport layer proximate to the light emitting layer and having one-tenth or less of thickness of the electron transport layer is not less than 20 wt. % and not more than 60 wt. %.

Optionally, a weight content of the first electron transport material in the electron transport layer decreases 1 wt. % per nanometer approaching from the electron transport layer to the light emitting layer.

Optionally, the electron transport layer includes a first electron transport sublayer and a second electron transport sublayer that are stacked, and the second electron transport sublayer is arranged on a surface of the first electron transport sublayer proximate to the light emitting layer; in which a ratio of a weight content of the first electron transport material to that of the second electron transport material in the first electron transport sublayer is not more than 6:4 and not less than 1:1; and in which a ratio of a weight content of the first electron transport material to that of the second electron transport material in the second electron transport sublayer is not more than 4:6 and not less than 3:7.

Optionally, the first electron transport material and the second electron transport material are independently selected from a group consisting of metal complexes, oxadiazoles, five-membered heterocyclic compounds containing nitrogen, and six-membered heterocyclic compounds containing nitrogen.

In a second aspect, an embodiment of the present disclosure provides a display panel, including the electroluminescent device as described in any of the above embodiments.

In a third aspect, an embodiment of the present disclosure provides a display device, including the electroluminescent device as described in any of the above embodiments or the display panel as described in any of the above embodiments.

In a fourth aspect, an embodiment of the present disclosure provides a method for preparing electroluminescent device, including: preparing an electron transport layer by simultaneously depositing a first electron transport material and a second electron transport material on a surface of the light emitting layer of the electroluminescent device, in which in the depositing, a ratio of a deposition rate of the first electron transport material calculated in a thickness deposited per second (nm/s) to a deposition rate of the second electron transport material calculated in a thickness deposited per second (nm/s) is increased; and preparing a cathode layer on the electron transport layer, in which an LUMO energy level of the first electron transport material is lower than an LUMO energy level of the second electron transport material.

Optionally, in the depositing, the deposition rate of the first electron transport material is gradually adjusted from a first deposition rate to a third deposition rate, and the deposition rate of the second electron transport material is gradually adjusted from a second deposition rate to a fourth deposition rate, in which a ratio of the third deposition rate to the fourth deposition rate is greater than a ratio of the first deposition rate to the second deposition rate.

Optionally, the depositing the first electron transport material and the second electron transport material is divided into a deposition step for a first time period and a deposition step for a second time period, in which in the first time period, the first electron transport material is deposited on the light emitting layer of the electroluminescent device at a first deposition rate, and the second electron transport material is deposited on the light emitting layer of the electroluminescent device at a second deposition rate; in which in the second time period, the first electron transport material is deposited on the light emitting layer of the electroluminescent device at a third deposition rate, and the second electron transport material is deposited on the light emitting layer of the electroluminescent device at a fourth deposition rate; and in which a ratio of the third deposition rate to the fourth deposition rate is greater than a ratio of the first deposition rate to the second deposition rate.

Optionally, the first deposition rate is less than the second deposition rate, the second deposition rate is less than the third deposition rate, and the second deposition rate is equal to the fourth deposition rate; alternatively, the first deposition rate is equal to the third deposition rate, the second deposition rate is more than the first deposition rate, and the third deposition rate is more than the fourth deposition rate; alternatively, the first deposition rate is less than the third deposition rate, and the second deposition rate is less than the fourth deposition rate.

Optionally, a ratio of the first deposition rate to the second deposition rate is not more than 4:6 and not less than 3:7; and/or, a ratio of the third deposition rate to the fourth deposition rate is not more than 6:4 and not less than 1:1.

In the electroluminescent element or the display panel or display device according to the present disclosure, or in the method according to the present disclosure, the electron transport layer is prepared by using a mixed electron transport material including electron transport materials of at least two different LUMO energy levels, and a ratio of the weight content EM1/EM2 of the first electron transport material having a low LUMO energy level to the second electron transport material having a high LUMO energy level decreases in a direction from the cathode layer to the light emitting layer, so that the LUMO energy level of the electron transport layer is closer to the LUMO energy level of the light emitting layer, thereby reducing the potential barrier at the interface between the electron transport layer and the light emitting layer. Therefore, the electron transport layer of the electroluminescent device of the present disclosure is beneficial to reducing the carrier accumulation at the interface between the electron transport layer and the light emitting layer, and improve the electron injection capability, thereby improving the efficiency and lifetime of the electroluminescent device.

DETAILED DESCRIPTION

Figure 1:
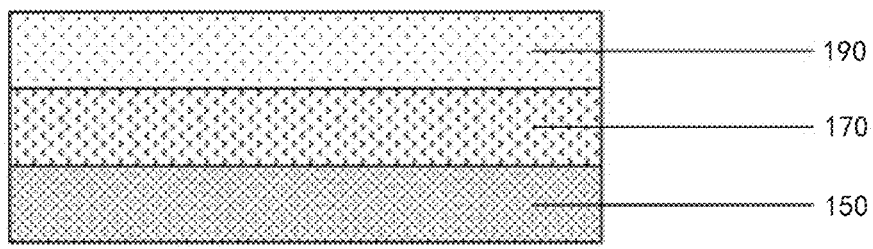
FIG. 1 is a schematic diagram showing an electroluminescent device according to one embodiment of the present disclosure.

The technical solutions and technical effects of the present disclosure will be described in detail below in conjunction with the accompanying drawings and specific embodiments. In the accompanying drawings of the present disclosure, the same or similar reference numerals are used to refer to the same or similar elements, or elements having the same or similar functions. The exemplary embodiments described below in conjunction with the accompanying drawings are merely illustrative of the technical solutions and technical effects of the present disclosure, but should not be construed as limiting to the present disclosure.

First, several terms involved in the present disclosure will be defined.

Lowest unoccupied molecular orbital (LUMO): the lowest unoccupied molecular orbital, that is, the orbital having the lowest energy level of unoccupied electrons.

Energy level: electrons can only move on specific, separate orbits outside the nucleus, in which the electrons on each orbit have separate energy, and these energy values are energy levels.

The ratio of the weight content EM1/EM2 of the first electron transport material to the second electron transport material: when the material constituting the electron transport layer includes at least the first electron transport material and the second electron transport material, the ratio of the weight content of the first electron transport material is the weight percentage of the first electron transport material relative to all electron transport materials in the selected area, and the ratio of the weight content of the second electron transport material is the weight percentage of the second electron transport material relative to all electron transport materials in the selected area. Therefore, the ratio of the weight content EM1/EM2 of the first electron transport material to that the second electron transport material is the ratio of the above two weight percentage, that is, the weight ratio of the first electron transport material to the second electron transport material in the selected area of the electron transport layer.

The inventor of the present disclosure has conducted research and found the following problems. When the current red, green, and blue primary color elements of organic light emitting diodes all use a common electron transport layer, due to the different energy levels of the red, green, and blue light emitting layers, there are certain energy barriers between the electron transport layer and the blue light emitting layer and between the electron transport layer and the green light emitting layer. This makes carriers accumulate at the interfaces between the blue light emitting layer and the electron transport layer and between the green light emitting layer and the electron transport layer, and thus the lifetime and efficiency of the organic light emitting diode light-emitting devices are adversely affected to some extent.

The electroluminescent device and the method for preparing the same provided in the present disclosure, the display panel and the display device including the electroluminescent device solve the above-mentioned problems existing in the prior art.

According to an embodiment of the present disclosure, an electroluminescent device is provided, including a light emitting layer, a cathode layer, and an electron transport layer arranged between the light emitting layer and the cathode layer; in which the electron transport layer is a layer of a mixed electron transport material including a first electron transport material and a second electron transport material, and an LUMO energy level of the first electron transport material is lower than that of the second electron transport material; and in which a ratio of a weight content of the first electron transport material to that the second electron transport material is EM1/EM2, and the EM1/EM2 decreases in a direction from a surface of the electron transport layer proximate to the cathode layer to a surface of the electron transport layer proximate to the light emitting layer.

The technical solution of the present disclosure and how the technical solution of the present disclosure solves the above technical problems will be described in detail below in conjunction with FIG. 1 and specific embodiments.

As shown in FIG. 1, an embodiment of the present disclosure provides an electroluminescent device 100, including a light emitting layer 150, a cathode layer 190, and an electron transport layer 170 arranged between the light emitting layer 150 and the cathode layer 190. The electron transport layer 170 is made of a mixed electron transport material including a first electron transport material and a second electron transport material, and an LUMO energy level of the first electron transport material is lower than that of the second electron transport material. In the electron transport layer 170, the ratio of the weight content EM1/EM2 of the first electron transport material to that of the second electron transport material decreases in a direction from the cathode layer 190 to the light emitting layer 150.

In the above embodiment, the electroluminescent device 100 may be a layer of a mixed electron transport material including at least two electron transport materials having different LUMO energy levels; and in the electron transport layer, the weight content of the electron transport material with a lower LUMO energy level is reduced in a direction from a surface thereof proximate to the cathode layer 190 to a surface thereof proximate to the light emitting layer 150. The weight content herein is the ratio or percentage of the weight of the electron transport material having a lower LUMO energy level to the weight of all the electron transport materials in a certain selected area of the electron transport layer 170. The configuration of the above-mentioned embodiment can increase the LUMO energy level of the electron transport layer 170 in a direction from a surface thereof proximate to the cathode layer 190 to a surface thereof proximate to the light emitting layer 150, and it is beneficial to reducing the potential barrier at the interface between the electron transport layer 170 and the light emitting layer 150. Therefore, in the electroluminescent device of the present disclosure, the electron transport layer can reduce the carrier accumulation at the interface between the electron transport layer and the light emitting layer, and improve the electron injection capability, thereby improving the efficiency and lifetime of the electroluminescent device 100.

For example, an LUMO energy level of the first electron transport material may be −3.4 eV, and an LUMO energy level of the second electron transport material may be −2.9 eV.

Optionally, the electron transport layer 170 has a thickness in a range from 10 to 80 nm. For example, the thickness may be 10 nm, 30 nm, 50 nm or 80 nm. Of course, the thickness of the electron transport layer 170 can also be other thicknesses that meet product requirements.

The film forming method of the electron transport layer 170 may be selected according to the type of materials and the chemical properties and physical properties thereof. Optionally, the electron transport layer 170 may be formed by methods, such as vacuum evaporation, chemical vapor deposition, coating, inkjet, or screen printing. The specific method for preparing the electron transport layer 170 will be described in detail in the following embodiments.

In some optional embodiments, the ratio EM1/EM2 of the weight content of the first electron transport material to that the second electron transport material gradually decreases in a direction from a surface of the electron transport layer 170 proximate to the cathode layer 190 to a surface of the electron transport layer 170 proximate to the light emitting layer 150, that is, it gradually decreases in a direction from the cathode layer 190 to the light emitting layer 150. The EM1/EM2 may also gradually decrease in a gradient manner. For example, a weight content of the first electron transport material in the electron transport layer decreases 1 wt. % per nanometer approaching from the electron transport layer to the light emitting layer.

In the above-mentioned embodiment, the ratio of the weight content of the first electron transport material having a lower LUMO energy level to that of the second electron transport material having a larger LUMO energy level is set to gradually decrease in a direction from a surface of the electron transport layer 170 proximate to the cathode layer 190 to a surface thereof proximate to the light emitting layer 150 (or decreases in a gradient manner), and the LUMO energy level of the electron transport layer 170 gradually increases in a direction from a surface thereof to the cathode layer 190 to a direction from a surface thereof to the light emitting layer 150 (that is, gradient energy level is formed), which is beneficial to reduce a potential barrier at the interface between the electron transport layer 170 and the light emitting layer 150. Therefore, in the electroluminescent element of the above embodiment, the electron transport layer can reduce the carrier accumulation at the interface, and improve the electron injection capability, thereby improving the efficiency and lifetime of the electroluminescent device 100. It should be understood that when the change level is small enough (1% change in weight content per 1 nm approaching), the change in the LUMO energy level of the electron transport layer 170 can be regarded as a linear change, that is, the change is more delicate and is more conducive to improving the efficiency of electron transmission.

Optionally, a content of the first electron transport material in a part of the electron transport layer 170 proximate to the cathode layer 190 and having one-tenth or less (preferably one-twentieth or less, even more preferably one-thirtieth or less) of thickness of the electron transport layer is not less than 40 wt. % and not more than 80 wt. %; and a content of the first electron transport material in a part of the electron transport layer 170 proximate to the light emitting layer 150 and having one-tenth or less (preferably one-twentieth or less, even more preferably one-thirtieth or less) of thickness of the electron transport layer is not less than 20 wt. % and not more than 60 wt. %. The electron transport layer 170 of this embodiment is further beneficial to reducing the potential barrier at the interface between the electron transport layer 170 and the light-emitting layer 150, thereby reducing the carrier accumulation at the interface. Therefore, the electron transport layer of the this embodiment not only improves the ability of electron injection, and it will not cause part of the electrons to be lost due to the excessive difference between the electron transport layers and/or the excessively high energy barrier.

Figure 2:
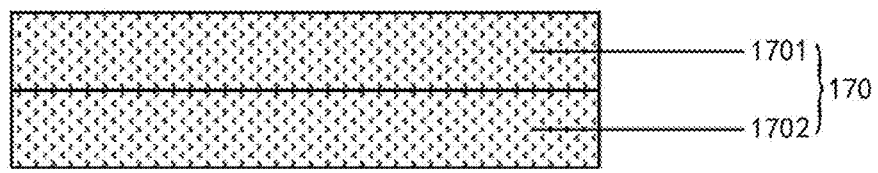
FIG. 2 is a schematic diagram of an electron transport layer in an electroluminescent device according to one embodiment of the present disclosure.

In some optional embodiments, the electron transport layer 170 includes a first electron transport sublayer 1701 and a second electron transport sublayer 1702 that are stacked, and the second electron transport sublayer 1702 is arranged on a surface of the first electron transport sublayer 1701 proximate to the light emitting layer 150, as shown in FIG. 2. A ratio of the weight content of the first electron transport material to that of the second electron transport material in the first electron transport sublayer 1701 is not more than 6:4 and not less than 1:1; and a ratio of the weight content of the first electron transport material to that of the second electron transport material in the second electron transport sublayer 1702 is not more than 4:6 and not less than 3:7.

In the above embodiment, the ratio of the weight content of the first electron transport material to that of the second electron transport material in each electron transport sublayer is fixed, which is beneficial to simplifying the preparation process of each electron transport sublayer, and is beneficial to realizing the independent preparation of each electron transport sublayer and the bonding assembly between the electron transport sublayers. In addition, the first electron transport sublayer 1701 and the second electron transport sublayer 1702 use the above-mentioned ratio of the weight content, and it is beneficial to reducing the potential barrier at the interface between the electron transport layer 170 and the light-emitting layer 150, and is beneficial to reducing the carrier accumulation at the interface. Therefore, the electron transport layer of the this embodiment not only improves the ability of electron injection, and it will not cause part of the electrons to be lost due to the excessive difference between the electron transport layers and/or the excessively high energy barrier.

Optionally, the first electron transport material and the second electron transport material are independently selected from a group consisting of metal complexes, oxadiazoles, five-membered heterocyclic compounds containing nitrogen, and six-membered heterocyclic compounds containing nitrogen. For example, the first electron transport material may be o-phenanthroline, for example, 4,7-diphenyl-1,10-phenanthroline (Bphen), whose LUMO energy level is −3.00 eV; the second electron transport material may be a metal complex, for example, 8-hydroxyquinoline aluminum (Alq3), whose LUMO energy level is −2.85 eV.

Figure 3:
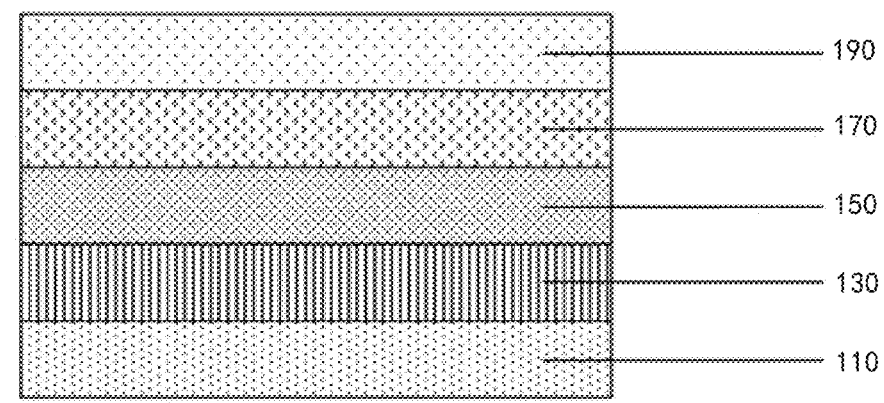
FIG. 3 is a schematic view showing an electroluminescent device according to another embodiment of the present disclosure.

In the electroluminescent device 100 using the organic light emitting diode (OLED) structure, as shown in FIG. 3, in addition to the light emitting layer 150, the electron transport layer 170, and the cathode layer 190, it further includes an anode layer 110 and a hole transport layer 130.

The material constituting the anode layer 110 may be a material beneficial to injection of holes into the light emitting layer 150, such as a metal, a metal oxide, or a combination thereof. For example, the material may be silver, gold, etc. or the alloys thereof. it may also be indium tin oxide (ITO), indium zinc oxide (IZO), fluorine-doped $SnO_2$ ($SnO_2$:F, abbreviated as FTO), etc. The anode layer 110 may be formed by vacuum evaporation, or the anode layer 110 may be formed by chemical vapor deposition, coating, inkjet, or screen printing.

The material constituting the cathode layer 190 may be a material beneficial to injection of electrons into the light emitting layer 150, for example, silver, aluminum, magnesium, calcium, etc., or the alloys thereof. Optionally, the material constituting the cathode layer 190 may be aluminum or a magnesium-silver alloy.

The light emitting layer 150 may be arranged between the cathode layer 190 and the anode layer 110. The light emitting layer 150 may be formed on the anode layer 110 by methods such as vacuum evaporation, coating, inkjet, and screen printing. The light emitting layer 150 may be a single layer or multiple layers. It should be noted that the film forming process can be selected according to the type of material and the chemical and physical properties thereof.

The light emitting material constituting the light emitting layer 150 may be an organic material, a perovskite material, or a quantum dot material. Optionally, the material constituting the light emitting layer 150 may be an organic small molecule light emitting material, for example: oxadiazole and its derivatives, triazole and its derivatives, rhodamine and its derivatives, 1,8-naphthimide derivatives, pyrazoline derivatives, triphenylamine derivatives, porphyrin compounds, carbazole, pyrazine, thiazole derivatives or perylene derivatives, silole, tetraphenylethylene and its derivatives, etc. Optionally, the material constituting the light emitting layer 150 may be an organic polymer material, such as polyphenylene vinylene, polythiophene, polyfluorene, polyacetylene, polycarbazole, polypyridine, and polyfuran-based electroluminescent materials. Optionally, the material constituting the light emitting layer 150 may be a perovskite material, such as cesium lead bromide ($CsPbBr_3$), methylamine lead bromide ($MAPbBr_3$), cesium silver indium chloride ($Cs_2AgInCl_6$), etc. Optionally, the material constituting the light emitting layer 150 may be a quantum dot light emitting material, for example, indium phosphide/zinc sulfide (InP/ZnS), cadmium selenide/zinc sulfide (CdSe/ZnS), lead sulfide (PbS) quantum dots, etc.

The hole transport layer 130 may be arranged between the anode layer 110 and the light emitting layer 150. The hole transport layer 130 is used to transport holes to the light emitting layer 150, can increase the hole mobility, and can allow more holes to be transported to the light emitting layer 150.

The electron transport layer 170 may be arranged between the cathode layer 190 and the light emitting layer 150. The electron transport layer 170 is used to transport electrons from the cathode layer 190 to the light emitting layer 150 in a timely manner. It can improve the electron mobility, and can allow more electrons to be transported to the light emitting layer 150. Eventually, electrons and holes recombine in the light emitting layer 150 to emit light, thereby displaying an image.

Figure 4:
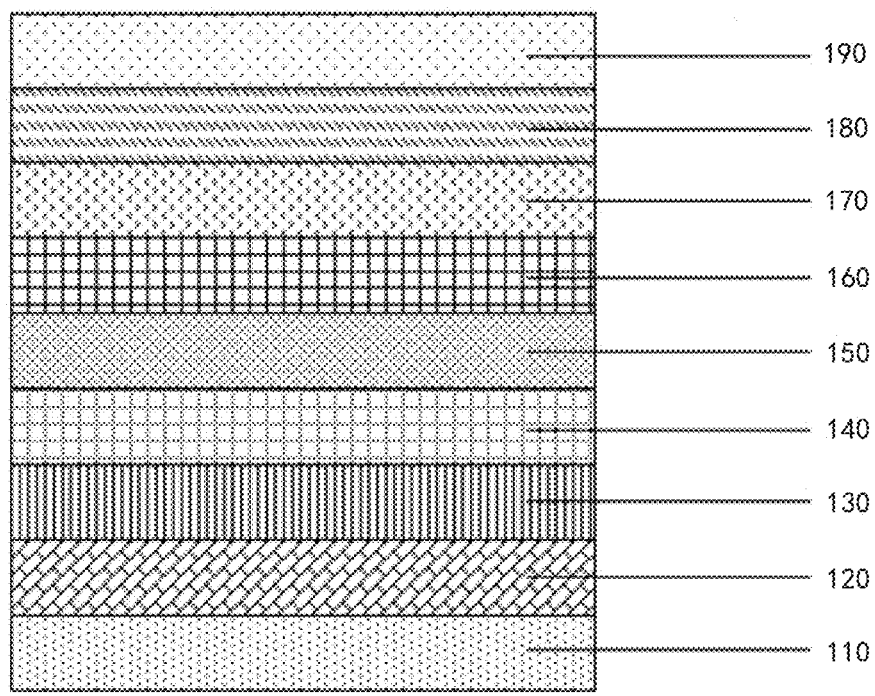
FIG. 4 is a schematic diagram showing an electroluminescent device according to yet another embodiment of the present disclosure.

In some optional embodiments, as shown in FIG. 4, the electroluminescent device 100 may further include a hole injection layer 120, an electron blocking layer 140, a hole blocking layer 160 and an electron injection layer 180. The hole injection layer 120 may be arranged between the anode layer 110 and the hole transport layer 130, to improve the work function of the anode surface and improve hole injection. The electron blocking layer 140 may be arranged between the hole injection layer 120 and the light emitting layer 150, to confine the holes in the light emitting layer 150 within the light emitting layer 150. The hole blocking layer 160 may be arranged between the light emitting layer 150 and the electron blocking layer 140, to confine the electrons in the light emitting layer 150 within the light emitting layer 150. The electron injection layer 180 may be arranged between the cathode layer 190 and the electron transport layer 170, to modify the interface between the cathode layer 190 and the electron transport layer 170, thereby improving electron injection.

Figure 5:
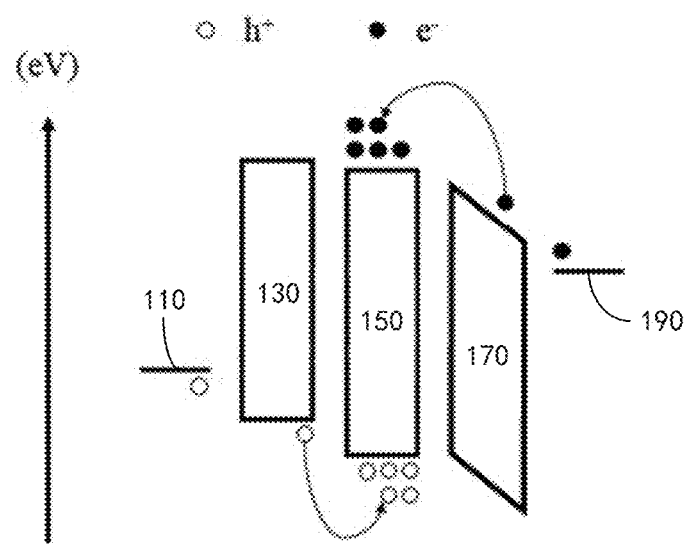
FIG. 5 is a schematic diagram showing an energy level of an electroluminescent device according to an embodiment of the present disclosure.

In the above embodiment, as shown in FIG. 5, a voltage can be applied to the cathode layer 190 and the anode layer 110, so that electrons ($e^-$) and holes ($h^+$) pass through the electron transport layer 170 and the hole transport layer 130, respectively, to recombine in the light emitting layer 150 and emit light. During this process, since the ratio of the weight content of the first electron transport material to the total electron transport material can be reduced in the direction from the cathode layer 190 to the light emitting layer 150, the LUMO energy level of the electron transport layer 170 can gradually increase in the direction from the cathode layer 190 to the light emitting layer 150. This is beneficial to reducing the potential barrier of the interface between the electron transport layer 170 and the light emitting layer 150 (or the hole blocking layer 160), and is beneficial to reducing the carrier accumulation at the interface, thereby improving electron injection, and improving the efficiency and lifetime of electroluminescent device 100.

Figure 6:
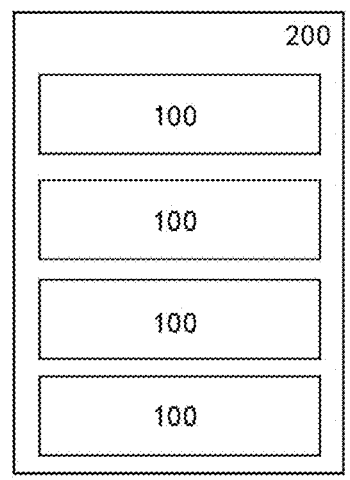
FIG. 6 is a schematic view showing a display panel according to an embodiment of the present disclosure.

Based on the same inventive concept, another embodiment of the present disclosure provides a display panel 200, including the electroluminescent device 100 provided in any of the foregoing embodiments, specifically as shown in FIG. 6. In this embodiment, since the display panel uses the electroluminescent device 100 provided by any of the foregoing embodiments, please refer to the foregoing embodiments for the principle and technical effect, which will not be repeated herein.

Figure 7:
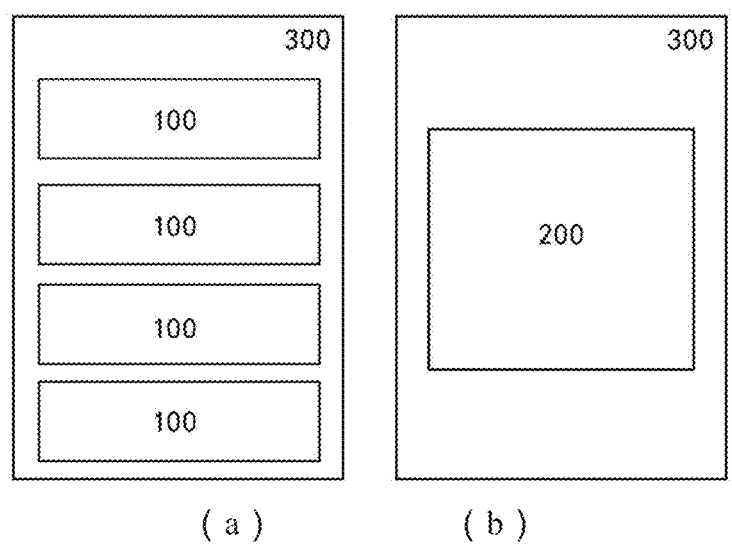
FIG. 7 is a schematic view showing a display device according to an embodiment of the present disclosure.

Based on the same inventive concept, another embodiment of the present disclosure provides a display device 300, including the electroluminescent device 100 provided in any of the foregoing embodiments; or including the display panel provided in any of the foregoing embodiments, specifically as shown in FIG. 7. FIG. 7(a) is a display device 300 including several electroluminescent devices 100; and FIG. 7(b) is a display device 300 including a display panel 200.

The display device may include any product or component having a display function, such as a television, a digital photo frame, a mobile phone, a smart watch, and a tablet computer. In this embodiment, since the display device uses the electroluminescent device 100 provided by any of the foregoing embodiments, or the display panel provided by any of the foregoing embodiments, please refer to the foregoing embodiments for the principle and technical effects, which will not be repeated herein.

Based on the same inventive concept, another embodiment of the present disclosure provides a method for preparing the electroluminescent device 100, including: preparing an electron transport layer 170 by simultaneously depositing a first electron transport material and a second electron transport material on a surface of the light emitting layer 150 of the electroluminescent device 100, in which in the depositing, a ratio of a deposition rate of the first electron transport material calculated in a thickness deposited per second (nm/s) to a deposition rate of the second electron transport material calculated in a thickness deposited per second (nm/s) is increased; and preparing a cathode layer on the electron transport layer, in which an LUMO energy level of the first electron transport material is lower than an LUMO energy level of the second electron transport material.

In this embodiment, the electron transport layer 170 is prepared by a deposition method, which is beneficial to achieve a sufficient mixing of the first electron transport material and the second electron transport material having different LUMO energy levels. Moreover, by controlling the deposition rates of the first electron transport material and the second electron transport material, the ratio of the weight content of the first electron transport material to that of the second electron transport material in the deposited electron transport layer 170 can be controlled to increase in a direction from a surface thereof proximate to the light emitting layer 150 to a surface thereof proximate to the cathode layer 190 (that is, it decreases in a direction from a surface of the electron transport layer 170 proximate to the cathode layer 190 to a surface thereof proximate to the light emitting layer 150). This is beneficial to reducing the potential barrier at the interface between the electron transport layer 170 and the light emitting layer 150, and is beneficial to reducing the carrier accumulation at the interface, thereby improving the electron injection capability, and improving the efficiency and lifetime of the electroluminescent device 100.

Optionally, in the method of the embodiment of the present disclosure, the electron transport layer 170 is prepared by a vacuum evaporation method. This is beneficial to controlling the deposition ratio of the first electron transport material to the second electron transport material, thereby improving the accuracy of preparing the electron transport layer 170. For example, if the evaporation rate of the first electron transport material is 0.04 nm/s, and the evaporation rate of the second electron transport material is 0.06 nm/s, the ratio of the first electron transport material respective to the total electron transport material (the first electron transport material and the second electron transport material) is 40%.

Optionally, in the foregoing depositing, the deposition rate of the first electron transport material is gradually adjusted from a first deposition rate to a third deposition rate, and the deposition rate of the second electron transport material is gradually adjusted from a second deposition rate to a fourth deposition rate, in which a ratio of the third deposition rate to the fourth deposition rate is greater than a ratio of the first deposition rate to the second deposition rate.

Optionally, the first deposition rate is less than the second deposition rate, the second deposition rate is less than the third deposition rate, and the second deposition rate is equal to the fourth deposition rate. That is, the deposition rate of the first electron transport material gradually increases, and the deposition rate of the second electron transport material does not change. Optionally, the first deposition rate is equal to the third deposition rate, the second deposition rate is more than the first deposition rate, and the third deposition rate is more than the fourth deposition rate. That is, the deposition rate of the second electron transport material gradually decreases, and the deposition rate of the first electron transport material does not change. Optionally, the first deposition rate is less than the third deposition rate, and the second deposition rate is more than the fourth deposition rate. That is, the deposition rate of the first electron transport material gradually increases, and the deposition rate of the second electron transport material gradually decreases. Through the above optional embodiments, the ratio of the weight content of the first electron transport material to that of the second electron transport material in the formed electron transport layer 170 can be reduced in a direction from a surface of the electron transport layer 170 proximate to the cathode layer 190 to a surface thereof proximate the light emitting layer 150.

In some optional embodiments, the depositing the first electron transport material and the second electron transport material is divided into a deposition step for a first time period and a deposition step for a second time period, in which in the first time period, the first electron transport material is deposited on the light emitting layer 150 of the electroluminescent device 100 at a first deposition rate, and the second electron transport material is deposited on the light emitting layer 150 of the electroluminescent device 100 at a second deposition rate; in which in the second time period, the first electron transport material is deposited on the light emitting layer 150 of the electroluminescent device 100 at a third deposition rate, and the second electron transport material is deposited on the light emitting layer 150 of the electroluminescent device 100 at a fourth deposition rate; and in which a ratio of the third deposition rate to the fourth deposition rate is more than a ratio of the first deposition rate to the second deposition rate.

In this embodiment, after the deposition for the first time period, the first electron transport sublayer 1071 may be deposited on a surface of the light emitting layer 150 of the electroluminescent device 100. The ratio of the weight content of the first electron transport material to that of the second electron transport material in the first electron transport sublayer 1071 is fixed, and the ratio of the weight content of the first electron transport material to that of the second electron transport material is the ratio of the first deposition rate to the second deposition rate.

Similarly, after the deposition for the second period, the second electron transport sublayer 1072 can be deposited on a surface of the light emitting layer 150 of the electroluminescent device 100. The ratio of the weight content of the first electron transport material to that of the second electron transport material in the second electron transport sublayer 1072 is also fixed, and the ratio of the weight content of the first electron transport material to that of the second electron transport material is the ratio of the third deposition rate and the fourth deposition rate.

The method of the foregoing embodiment is beneficial to simplifying the preparation process of each electron transport sublayer, and is beneficial to realizing the independent preparation of each electron transport sublayer and the bonding assembly between the electron transport sublayers.

Optionally, the first deposition rate is less than the second deposition rate, the second deposition rate is less than the third deposition rate, and the second deposition rate is equal to the fourth deposition rate. That is, only the deposition rate of the first electron transport material decreases, and the deposition rate of the second electron transport material does not change. Optionally, the first deposition rate is equal to the third deposition rate, the second deposition rate is more than the first deposition rate, and the third deposition rate is more than the fourth deposition rate. That is, only the deposition rate of the second electron transport material increases, and the deposition rate of the first electron transport material does not change. Optionally, the first deposition rate is less than the third deposition rate, and the second deposition rate is more than the fourth deposition rate. That is: not only the deposition rate of the first electron transport material decreases, but also the deposition rate of the second electron transport material increases.

Optionally, the ratio of the first deposition rate to the second deposition rate is not more than 4:6 and not less than 3:7. Optionally, the ratio of the third deposition rate to the fourth deposition rate is not more than 6:4 and not less than 1:1.

The technical solutions and technical effects of the present disclosure will be further described in detail by way of specific embodiments.

As shown in FIG. 4, the electroluminescent device includes an anode layer 110, a hole injection layer 120, a hole transport layer 130, an electron blocking layer 140, a light emitting layer 150, a hole blocking layer 160, an electron transport layer 170, an electron injection layer 180 and a cathode layer 190 that are stacked in sequence. The electron transport layer 170 is formed by mixing and vapor deposition of two electron transport materials having different LUMO energy levels. The LUMO energy level of the first electron transport material is −3.2 eV, and the LUMO energy level of the second electron transport material is −2.6 eV. The electroluminescent devices having the following two structures were prepared.

Structure 1: The thickness of the first electron transport sublayer on the surface proximate to the cathode layer 190 in the electron transport layer 170 is 15 nm, and the ratio of the weight content of the first electron transport material to that of the second electron transport material is 6:4. The thickness of the second electron transport sublayer on the surface proximate to the light emitting layer 150 in the electron transport layer 170 is 15 nm, and the ratio of the weight content of the first electron transport material to that of the second electron transport material is 4:6.

Structure 2: The thickness of the electron transport layer 170 is 30 nm, and the ratio of the weight content of the first electron transport material to that of the second electron transport material in the electron transport layer 170 is a constant, i.e., 6:4.

Figure 8:
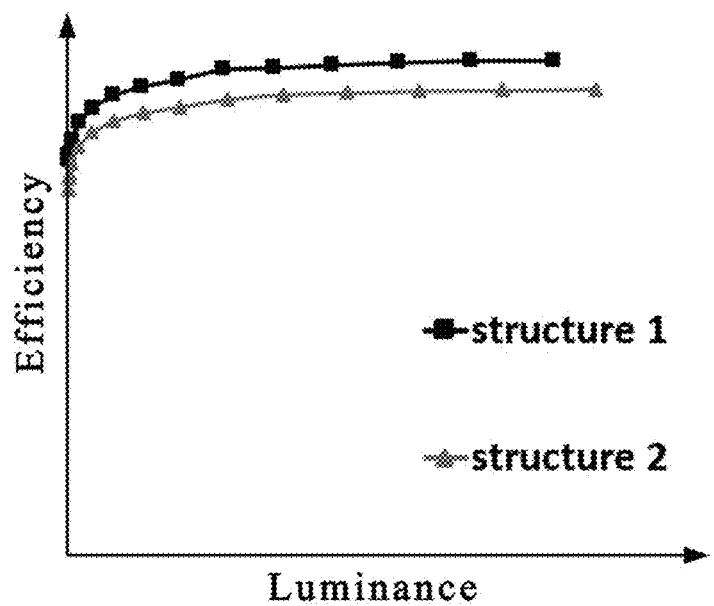
FIG. 8 is a graph showing efficiency and luminance of an electroluminescent device according to an embodiment of the present disclosure.
Figure 9:
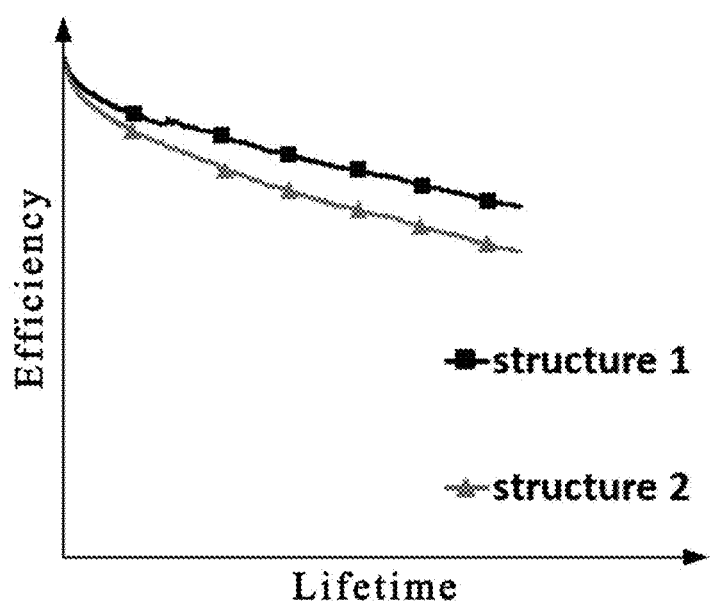
FIG. 9 is a graph showing luminance and lifetime of an electroluminescent device according to an embodiment of the present disclosure.

The efficiency and lifetime performances of the electroluminescent devices of the two structures are shown in FIG. 8 and FIG. 9, respectively. Specifically, in FIG. 8, the horizontal axis is luminance, and the vertical axis is efficiency. The efficiency herein is the blue light index (BI), that is, the ratio of the current efficiency to the color coordinate (CIE y), which is often used to evaluate the efficiency of blue light devices. "-■-" represents the graph of efficiency and luminance of the electroluminescent device using Structure 1, and "-▲-" represents the graph of efficiency and luminance of the electroluminescent device using Structure 2. As can be seen from FIG. 8, the efficiency of the electroluminescent device using Structure 1 is higher than the efficiency of the electroluminescent device using Structure 2.

In FIG. 9, the horizontal axis is the lifetime, and the vertical axis is the efficiency. The lifetime herein is the lifetime of the electroluminescent device under the same constant current. "-■-" represents the graph of luminance and lifetime of the electroluminescent device using Structure 1, and "-▲-" represents the graph of luminance and lifetime of the electroluminescent device using Structure 2. As can be seen from FIG. 9, the life attenuation of the electroluminescent device using Structure 1 is lower than the life attenuation of the electroluminescent device using Structure 2, that is, the lifetime of the electroluminescent device using Structure 1 is higher than the lifetime of the electroluminescent device using Structure 2.

Therefore, the efficiency and lifetime of the electroluminescent device using Structure 1 are higher than the efficiency and lifetime of the electroluminescent device using Structure 2.

The above-mentioned embodiments of the present disclosure can at least achieve the following beneficial technical effects.

1. In the electroluminescent device 100 of the embodiment of the present disclosure, the LUMO energy level of the electron transport layer 170 increases in a direction from a surface thereof proximate to the cathode layer 190 to a surface thereof proximate to the light emitting layer 150, which is beneficial to reducing the potential barrier at the interface between the electron transport layer 170 and the light emitting layer 150 and reducing the carrier accumulation at the interface, thereby improving the electron injection capability, and improving the efficiency and lifetime of the electroluminescent device 100.

2. In the method for preparing the electron transport layer 170 including the first electron transport sublayer and the second electron transport sublayer that are stacked, since the content ratio of the first electron transport material and the second electron transport material in each electron transport sublayer is fixed, the method is beneficial to simplifying the preparation process of each electron transport sublayer, and is beneficial to realizing the independent preparation of each electron transport sublayer and the bonding assembly between the electron transport sublayers.

3. The electron transport layer 170 is prepared by a deposition method, which is beneficial to achieve a sufficient mixing of the first electron transport material and the second electron transport material having different LUMO energy levels. Moreover, by controlling the deposition rates of the first electron transport material and the second electron transport material, the ratio of the weight content of the first electron transport material to that of the second electron transport material in the formed electron transport layer 170 can be controlled to increase in a direction from a surface thereof proximate to the light emitting layer 150 to a surface thereof proximate to the cathode layer 190 (that is, it decreases in a direction from a surface of the electron transport layer 170 proximate to the cathode layer 190 to a surface thereof proximate to the light emitting layer 150). This is beneficial to reducing the potential barrier at the interface between the electron transport layer 170 and the light emitting layer 150, and reducing the carrier accumulation at the interface, thereby improving the electron injection capability, and improving the efficiency and lifetime of the electroluminescent device 100.

In the description of the present disclosure, it should be noted that the terms "up", "down", "front", "back", "vertical", "horizontal", "top", "bottom", "inside", "outside", etc. indicating the orientation or spatial relationship is based on the orientation or spatial relationship shown in the drawings, and are merely for the convenience of describing the present invention and the simplification of the description, rather than indicating or implying that the referred device or element must have a particular orientation, or be constructed and operated in a particular orientation. Thus, it should not be construed as a limitation on the present invention. The terms "first" and "second" are merely used for descriptive purposes, and are not to be construed as indicating or implying a relative importance or implicitly indicating the number of technical features indicated. Thus, the features defined by "first" and "second" may include one or more of the features, either explicitly or implicitly. In the description of the present disclosure, "several" means two or more, unless otherwise defined.

In the description of the present disclosure, it should be noted that, unless expressly stated or limited otherwise, the terms "mount", "connect" or "join" shall be interpreted broadly, and may be, for example, fixed connection, removable connection, or integral connection; may be direct connection, or may be indirect connection through an intermediary medium, and may be the internal communication of two components. The specific meanings of the above terms in the present disclosure can be understood by a person skilled in the art on a case-by-case basis. In the description of the present disclosure, the specific features, structures, materials or features may be combined in any suitable manner in any one or more embodiments or examples.

The above descriptions are merely parts of embodiments in the present disclosure. It should be noted that one skilled in the art would make several improvements and substitutions without departing from the principles of the present disclosure. These improvements and modifications should also be regarded as the protection scope of the present disclosure.

What is claimed is:

1. An electroluminescent device, comprising a light emitting layer, a cathode layer, and an electron transport layer arranged between the light emitting layer and the cathode layer;
   wherein the electron transport layer is a layer of a mixed electron transport material comprising a first electron transport material and a second electron transport material, and an LUMO energy level of the first electron transport material is lower than that of the second electron transport material; and
   wherein a ratio of a weight content of the first electron transport material in the electron transport layer to that of the second electron transport material in the electron transport layer is EM1/EM2, and the EM1/EM2 decreases in a direction from a surface of the electron transport layer proximate to the cathode layer to a surface of the electron transport layer proximate to the light emitting layer.

2. The electroluminescent device of claim 1, wherein the EM1/EM2 gradually decreases in a direction from the cathode layer to the light emitting layer.

3. The electroluminescent device of claim 2, wherein a content of the first electron transport material in a part of the electron transport layer proximate to the cathode layer and having one-tenth or less of thickness of the electron transport layer is not less than 40 wt. % and not more than 80 wt. %; and a content of the first electron transport material in a part of the electron transport layer proximate to the light emitting layer and having one-tenth or less of thickness of the electron transport layer is not less than 20 wt. % and not more than 60 wt. %.

4. The electroluminescent device of claim 3, wherein a weight content of the first electron transport material in the electron transport layer decreases 1 wt. % per nanometer approaching from the electron transport layer to the light emitting layer.

5. The electroluminescent device of claim 1, wherein the electron transport layer comprises a first electron transport sublayer and a second electron transport sublayer that are stacked, and the second electron transport sublayer is arranged on a surface of the first electron transport sublayer proximate to the light emitting layer;
   wherein a ratio of a weight content of the first electron transport material to that of the second electron transport material in the first electron transport sublayer is not more than 6:4 and not less than 1:1; and
   wherein a ratio of a weight content of the first electron transport material to that of the second electron transport material in the second electron transport sublayer is not more than 4:6 and not less than 3:7.

6. The electroluminescent device of claim 1, wherein the first electron transport material and the second electron transport material are independently selected from a group consisting of metal complexes, oxadiazoles, five-membered heterocyclic compounds containing nitrogen, and six-membered heterocyclic compounds containing nitrogen.

7. A display panel, comprising the electroluminescent device of claim 1.

8. The display panel of claim 7, wherein the EM1/EM2 gradually decreases in a direction from the cathode layer to the light emitting layer.

9. The display panel of claim 8, wherein a content of the first electron transport material in a part of the electron transport layer proximate to the cathode layer and having one-tenth or less of thickness of the electron transport layer is not less than 40 wt. % and not more than 80 wt. %; and a content of the first electron transport material in a part of the electron transport layer proximate to the light emitting layer and having one-tenth or less of thickness of the electron transport layer is not less than 20 wt. % and not more than 60 wt. %.

10. The display panel of claim 7, wherein the electron transport layer comprises a first electron transport sublayer and a second electron transport sublayer that are stacked, and the second electron transport sublayer is arranged on a surface of the first electron transport sublayer proximate to the light emitting layer;
wherein a ratio of a weight content of the first electron transport material to that of the second electron transport material in the first electron transport sublayer is not more than 6:4 and not less than 1:1; and
wherein a ratio of a weight content of the first electron transport material to that of the second electron transport material in the second electron transport sublayer is not more than 4:6 and not less than 3:7.

11. A display device comprising the electroluminescent device of claim 1.

12. The display device of claim 11, wherein the EM1/EM2 gradually decreases in a direction from the cathode layer to the light emitting layer.

13. The display device of claim 12, wherein a content of the first electron transport material in a part of the electron transport layer proximate to the cathode layer and having one-tenth or less of thickness of the electron transport layer is not less than 40 wt. % and not more than 80 wt. %; and a content of the first electron transport material in a part of the electron transport layer proximate to the light emitting layer and having one-tenth or less of thickness of the electron transport layer is not less than 20 wt. % and not more than 60 wt. %.

14. The display device of claim 11, wherein the electron transport layer comprises a first electron transport sublayer and a second electron transport sublayer that are stacked, and the second electron transport sublayer is arranged on a surface of the first electron transport sublayer proximate to the light emitting layer;
wherein a ratio of a weight content of the first electron transport material to that of the second electron transport material in the first electron transport sublayer is not more than 6:4 and not less than 1:1; and
wherein a ratio of a weight content of the first electron transport material to that of the second electron transport material in the second electron transport sublayer is not more than 4:6 and not less than 3:7.

15. A method for preparing an electroluminescent device, comprising:
preparing an electron transport layer by simultaneously depositing a first electron transport material and a second electron transport material on a surface of a light emitting layer of the electroluminescent device, wherein in the depositing, a ratio of a deposition rate of the first electron transport material calculated in a thickness deposited per second (nm/s) to a deposition rate of the second electron transport material calculated in a thickness deposited per second (nm/s) is increased; and
preparing a cathode layer on the electron transport layer,
wherein an LUMO energy level of the first electron transport material is lower than that of the second electron transport material.

16. The method of claim 15, wherein in the depositing, the deposition rate of the first electron transport material is gradually adjusted from a first deposition rate to a third deposition rate, and the deposition rate of the second electron transport material is gradually adjusted from a second deposition rate to a fourth deposition rate,
wherein a ratio of the third deposition rate to the fourth deposition rate is greater than a ratio of the first deposition rate to the second deposition rate.

17. The method according to claim 15, wherein the depositing the first electron transport material and the second electron transport material is divided into a deposition step for a first time period and a deposition step for a second time period,
wherein in the first time period, the first electron transport material is deposited on the light emitting layer of the electroluminescent device at a first deposition rate, and the second electron transport material is deposited on the light emitting layer of the electroluminescent device at a second deposition rate;
wherein in the second time period, the first electron transport material is deposited on the light emitting layer of the electroluminescent device at a third deposition rate, and the second electron transport material is deposited on the light emitting layer of the electroluminescent device at a fourth deposition rate; and
wherein a ratio of the third deposition rate to the fourth deposition rate is greater than a ratio of the first deposition rate to the second deposition rate.

18. The method of claim 16, wherein the first deposition rate is less than the second deposition rate, the second deposition rate is less than the third deposition rate, and the second deposition rate is equal to the fourth deposition rate;
or the first deposition rate is equal to the third deposition rate, the second deposition rate is more than the first deposition rate, and the third deposition rate is more than the fourth deposition rate;
or the first deposition rate is less than the third deposition rate, and the second deposition rate is less than the fourth deposition rate.

19. The method of claim 16, wherein a ratio of the first deposition rate to the second deposition rate is not more than 4:6 and not less than 3:7; and/or a ratio of the third deposition rate to the fourth deposition rate is not more than 6:4 and not less than 1:1.

20. The method of claim 17, wherein a ratio of the first deposition rate to the second deposition rate is not more than 4:6 and not less than 3:7; and/or a ratio of the third deposition rate to the fourth deposition rate is not more than 6:4 and not less than 1:1.

* * * * *